(12) United States Patent
Kim

(10) Patent No.: US 7,965,149 B2
(45) Date of Patent: Jun. 21, 2011

(54) RESISTOR-CAPACITOR OSCILLATOR

(75) Inventor: Chang Sun Kim, Gwangju-si (KR)

(73) Assignees: Medison Co., Ltd., Kangwon-do (KR); Hivolic Co., Seoul (KR)

( * ) Notice: Subject to any disclaimer, the term of this patent is extended or adjusted under 35 U.S.C. 154(b) by 49 days.

(21) Appl. No.: 12/502,138

(22) Filed: Jul. 13, 2009

(65) Prior Publication Data

US 2010/0013566 A1    Jan. 21, 2010

(30) Foreign Application Priority Data

Jul. 16, 2008   (KR) .................. 10-2008-0069022

(51) Int. Cl.
   *H03K 3/26*    (2006.01)

(52) U.S. Cl. ...... 331/111; 331/143; 331/135; 331/108 B

(58) Field of Classification Search .................. 331/111, 331/135, 108 B, 143
See application file for complete search history.

(56) References Cited

U.S. PATENT DOCUMENTS 6,356,161 B1 *  3/2002  Nolan et al. .................. 331/176

* cited by examiner

*Primary Examiner* — Arnold Kinkead
(74) *Attorney, Agent, or Firm* — McDermott Will & Emery LLP

(57) ABSTRACT

An embodiment for low power-consumption RC oscillator is disclosed. A voltage transforming unit transforms a power supply voltage to an internal voltage. A current mirroring unit is coupled to the voltage transforming unit and receives the internal voltage to provide constant two current outputs with different phases. A current charging/discharging unit includes first and second nodes to receive the two constant current outputs of the current mirroring unit, wherein first and second capacitors are coupled to the first and second nodes, respectively. The first and second capacitors are charged by the two constant current outputs. A voltage sensing and outputting unit is coupled to the first and second nodes, senses voltage levels of the first and second nodes and outputs clock signals when one of the sensed voltage levels is greater than a logic threshold. A pulse generating unit generates pulse signals in response to the clock signals. The current charging/discharging unit further includes a connection switch to electrically connect the first and second nodes in response to the pulse signals.

7 Claims, 5 Drawing Sheets

RESISTOR-CAPACITOR OSCILLATOR

The present application claims priority from Korean Patent Application No. 10-2008-0069022 filed on Jul. 16, 2008, the entire subject matter of which is incorporated herein by reference.

TECHNICAL FIELD

The present disclosure generally relates to a resistor-capacitor (RC) oscillator, and more particularly to a low power-consumption RC oscillator.

BACKGROUND

Clock signals and timing signals generated by a resistor-capacitor (RC) oscillator may be provided to various electronic circuits such as a micro processor, a micro controller, a flip-flop circuit, a latch circuit and the like. The RC oscillator has been extensively used in the electronic industries due to its fundamental function of generating clock and time signals.

Generally, in mobile devices using a battery such as a portable flat panel display, a mobile communication device and the like, a low power-consumption RC oscillator is required to increase the battery life after charging the battery once. Especially, as the resolution of the display screen increases, the number of pixels of the display screen also increases. In such a case, the power consumption of the RC oscillator is increased in proportion to a square of the power supply voltage. Thus, there has been a strong demand for an RC oscillator operating in low power consumption in the relevant field.

SUMMARY

One embodiment for a low power-consumption resistor-capacitor oscillator is disclosed herein. In one embodiment, by way of non-limiting example, a resistor-capacitor (RC) oscillator, comprises: a voltage transforming unit for transforming a power supply voltage to an internal voltage; a current mirroring unit coupled to the voltage transforming unit and being configured to receive the internal voltage to provide constant two current outputs with different phases; a current charging/discharging unit including first and second nodes to receive the two constant current outputs of the current mirroring unit; first and second capacitors coupled to the first and second nodes, respectively, to be charged by the two constant current outputs; a voltage sensing and outputting unit coupled to the first and second nodes and being configured to sense voltage levels of the first and second nodes and output clock signals when one of the sensed voltage levels is greater than a logic threshold; and a pulse generating unit for generating pulse signals in response to the clock signals, wherein the current charging/discharging unit further includes a connection switch to electrically connect the first and second nodes in response to the pulse signals.

The Summary is provided to introduce a selection of concepts in a simplified form that are further described below in the Detailed Description. This Summary is not intended to identify key or essential features of the claimed subject matter, nor is it intended to be used in determining the scope of the claimed subject matter.

DETAILED DESCRIPTION

A detailed description may be provided with reference to the accompanying drawings. One of ordinary skill in the art may realize that the following description is illustrative only and is not in any way limiting. Other embodiments of the present invention may readily suggest themselves to such skilled persons having the benefit of this disclosure.

Figure 1:
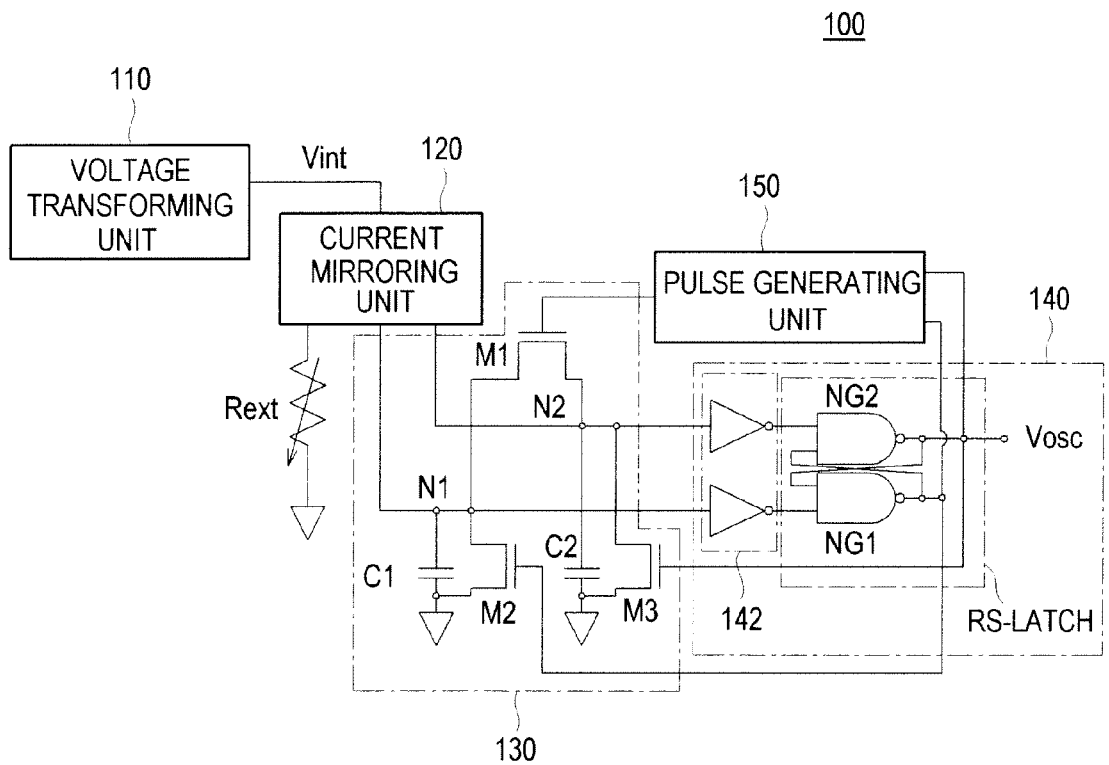
FIG. 1 is a schematic circuit diagram showing an illustrative embodiment of a resistor-capacitor (RC) oscillator.

FIG. 1 is a schematic circuit diagram showing an illustrative embodiment of a resistor-capacitor (RC) oscillator. Referring to FIG. 1, the RC oscillator 100 may include a voltage transforming unit 110, a current mirroring unit 120, a current charging/discharging unit 130, a voltage sensing and outputting unit 140 and a pulse generating unit 150.

The voltage transforming unit 310 may be operable to transform a power supply voltage Vdd into an internal voltage Vint, the voltage level of which is less than that of the power supply voltage. In one embodiment, since the voltage transforming unit 310 may decrease a level of the power supply voltage to be used in the RC oscillator, a total amount of power consumption of the RC oscillator may be reduced.

Figure 2:
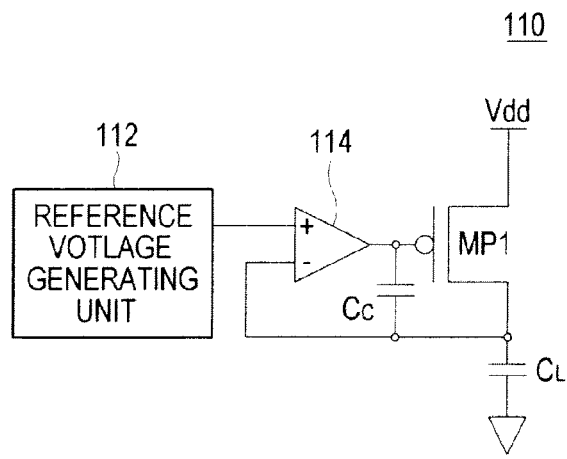
FIG. 2 is a circuit diagram showing an illustrative embodiment of a voltage transforming unit.

FIG. 2 is a circuit diagram showing an illustrative embodiment of the voltage transforming unit 110. Referring to FIG. 2, the voltage transforming unit 310 may include a reference voltage generator 112, which may be operable to generate a reference voltage. The voltage transforming unit 110 may further include an operational amplifier (OP AMP) 114, a P-type metal-oxide-semiconductor (PMOS) transistor MP1 and a compensation capacitor Cc. The reference voltage generated form the reference voltage generator 12 may be applied to a non-inverting input terminal of the OP AMP 114. The internal voltage Vint may be fed back to an inverting input terminal of the OP AMP 114. An output terminal of the OP AMP 114 may be coupled to a gate of the PMOS transistor MP1, which is coupled between the power supply voltage Vdd and the internal voltage Vint. Since the internal voltage Vint may depend on the PMOS transistor MP1, relatively low power consumption may be expected. The compensation capacitor Cc may be operable to compensate for a phase of the output signal of the OP AMP 114. The internal voltage Vint may be supplied to the current mirroring unit 120, the voltage sensing and outputting unit 140 and the pulse generating unit 350.

Figure 3:
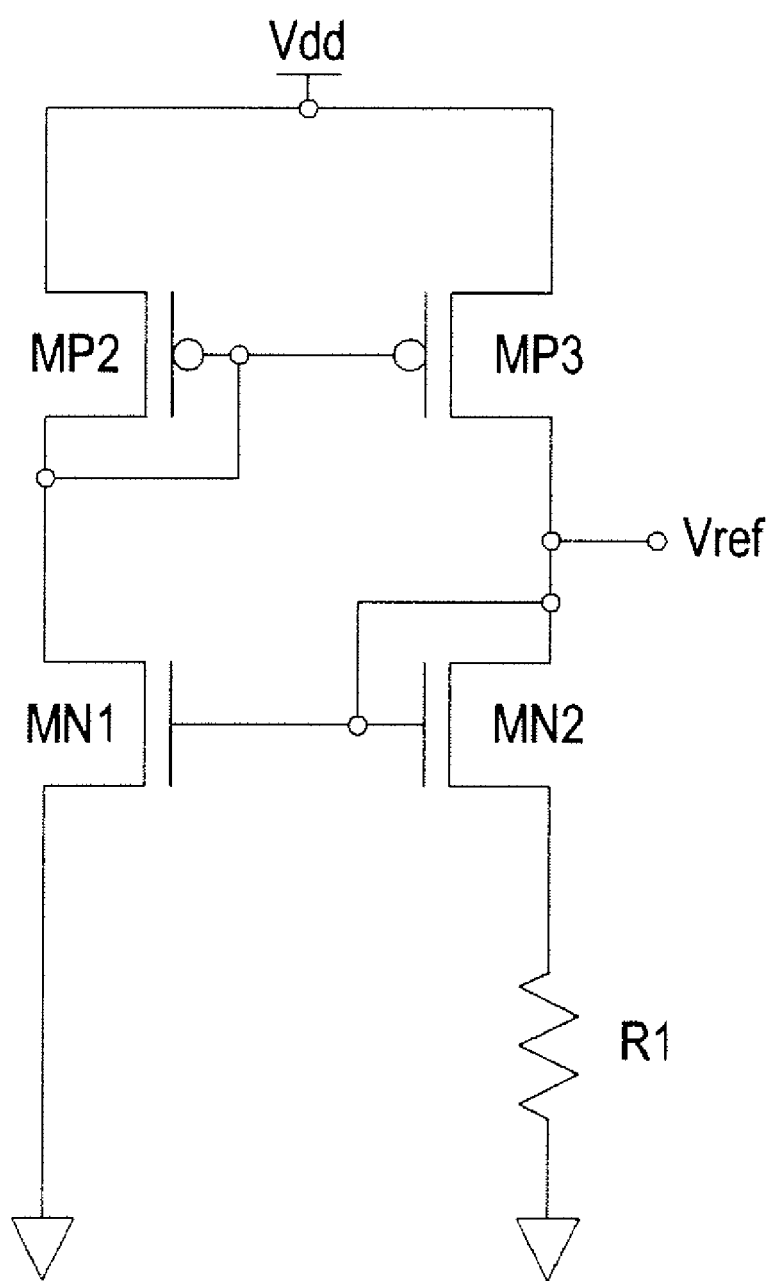
FIG. 3 is a circuit diagram showing an illustrative embodiment of a reference voltage generator in a voltage transforming unit.

FIG. 3 is a circuit diagram showing an illustrative embodiment of the reference voltage generator 112 in the voltage transforming unit 110. As illustrated in FIG. 3, the reference voltage generator 112 may include a pair of PMOS transistors MP2 and MP3 for current mirroring, N-type metal-oxide-semiconductor (NMOS) transistors MN1 and MN2, and a resistor R1. In one embodiment, the NMOS transistors MN1 and MN2 may be configured to operate at a saturation region. The NMOS transistor MN1 is connected between the PMOS transistor MP2 and the ground. The NMOS transistor MN2 is connected between the PMOS transistor MP3 and the resistor R1. The resistor R1 is coupled to the ground. Gates of the NMOS transistors MN1 and MN2, which are commonly connected to each other, receive a reference voltage Vref. In such a case, the reference voltage may be a sum of logic threshold voltage Vth of the NMOS transistors MN1 and MN2 and a voltage applied to the resistor R1, as represented by the following equation (1).

$$Vref = Vth2 + RI \quad (1)$$

wherein $I = \Delta Vth/R$. If differentiating $I = \Delta Vth/R$ with respect to a temperature T, then the following equation (2) can be obtained.

$$\frac{\delta I}{\delta T} = \frac{1}{R}\frac{\delta \Delta Vth}{\delta T} - \Delta Vth \frac{1}{R^2}\frac{\delta R}{\delta T} \quad (2)$$

If the equation (2) meets the condition of $\delta I/\delta T = 0$, then the current may be independent from the temperature. Also, after differentiating the equation (1) with respect to a temperature T, if the differentiated result meets the condition of $\delta Vref/\delta T = 0$, then the reference voltage Vref, which is compensated for the temperature, may be obtained.

The current mirroring unit 120 receives the internal voltage Vint from the voltage transforming unit 110. The current mirroring unit 120 may be operable to provide two constant current outputs to a first node N1 and a second node N2 of the current charging/discharging unit 130. The constant current outputs may be determined by the adjustment of an external variable resistor Rext. The current mirroring unit 120 may further include first and second capacitors C1 and C2 to be charged by the constant current outputs with different phases. In one embodiment, the current charging/discharging unit 130 may include a connection switch M1 for electrically connecting the first and second nodes N1 and N2, as well as discharge switches M2 and M3 for discharging capacitors C1 and C2. In one embodiment, the connection switch M1 and the discharge switches M2 and M3 may be embodied with NMOS transistors. However, the switches are not limited to such embodiments.

In one embodiment, when the first capacitor C1 is discharged, the connection switch M1 may be turned on such that the first node N1 is electrically connected to the second node N2. Thus, the current charged in the first capacitor C1 may be recycled to charge the second capacitor C2. Also, when the second capacitor C2 is discharged, the connection switch M1 may be turned on such that the second node N2 is electrically connected to the first node N1. As such, the current charged in the second capacitor C2 may be recycled to charge the first capacitor C1.

The voltage sensing and outputting unit 140 may be operable to sense a voltage level on the first node N1 and the second node N2. If the sensed voltage level is greater than a logic threshold, then the voltage sensing and outputting unit 140 may be operable to output clock signals. The voltage sensing and outputting unit 140 may include an RS latch configured with first and second NAND gates. In such a case, the clock signals may be the output signals of the RS latch. In one embodiment, the output signal of a first NAND gate may be applied to a gate of a first discharge switch M2. Further, the output signal of the second NAND gate may be applied to a gate of the second discharge switch M3. Thus, the first and second discharge switches M2 and M3 may be turned on/off in response to the output signals of the RS latch so that the currents charged in the capacitors C1 and C2 may be discharged.

The pulse generating unit 150 may be operable to pulses in response to the output signals of the voltage sensing and outputting unit 140. These pulses are applied to a gate of the connection switch M1 so that the first node N1 and the second node N2 may be periodically connected to each other. When the first discharge switch M2 is turned on in response to the output signal of the first NAND gate to discharge the current from the first capacitor C1, the discharged current may be supplied to the second node N2 through the connection switch M1. This is so that the discharged current can be recycled to charge the current to the second capacitor C2. Also, when the second discharge switch M3 is turned on in response to the output signal of the second NAND gate to discharge the current from the second capacitor C2, the discharged current may be supplied to the first node N1 through the connection switch M1 so that the discharged current can be recycled to charge the current to the first capacitor C1. In one embodiment, the connection switch M1 may be turned on at an initial stage of the charging/discharging operations.

Figure 4:
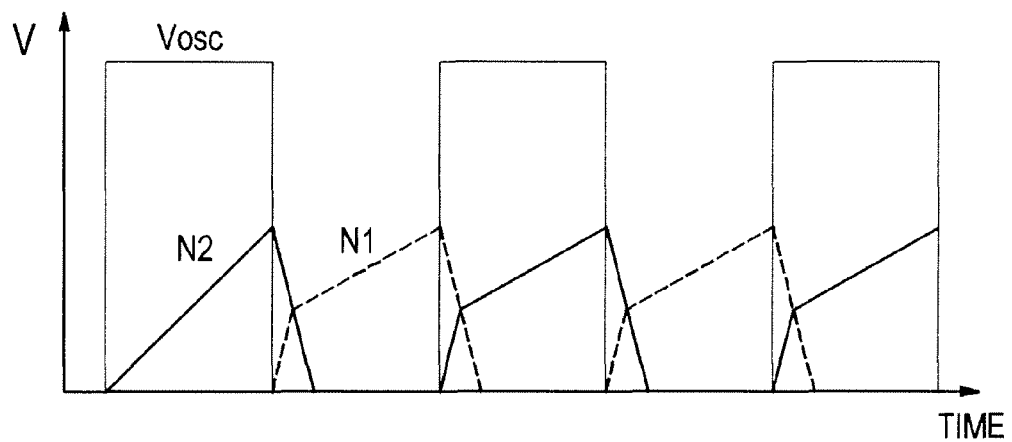
FIG. 4 is a schematic diagram showing a waveform of an output signal of an RC oscillator and a graph showing a change of voltage levels at first and second nodes when the first and second capacitors are charged/discharged.

FIG. 4 is a schematic diagram showing a waveform of an output signal Vosc of the RC oscillator and voltage levels at first and second nodes when the first and second capacitors are charged/discharged. As shown in FIG. 4, it can be seen that the current discharged from one capacitor is recycled to charge the other capacitor by using the connection switch M1.

Figure 5A:
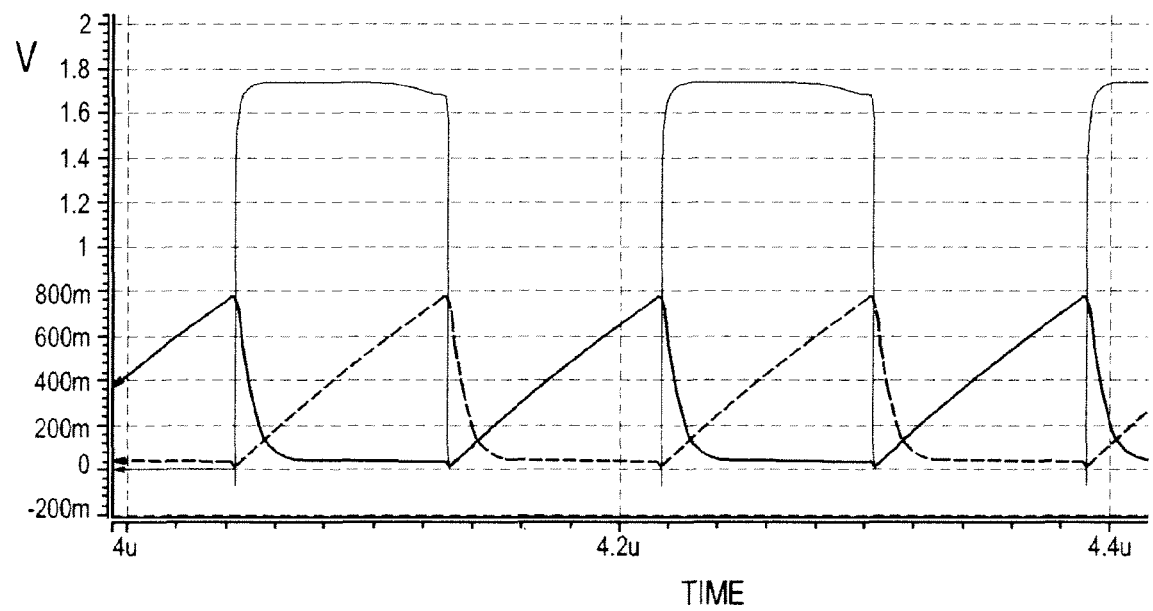
FIG. 5A is a waveform showing a result of simulation program with integrated circuit emphasis (Hspice) simulation of the output signal Vosc of the RC oscillator without adopting a current recycling scheme.
Figure 5B:
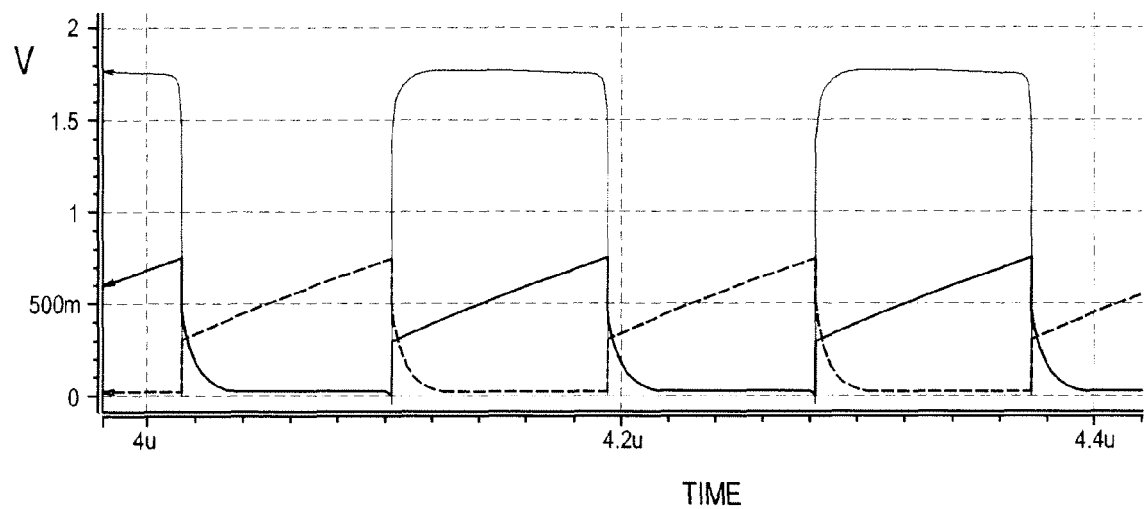
FIG. 5B is a waveform showing a result of Hspice simulation of the output signal Vosc of the RC oscillator with adopting a current recycling scheme according to the present invention.

FIG. 5A is a waveform showing a result of Simulation program with Integrated Circuit Emphasis (Hspice) simulation of the output signal Vosc of the RC oscillator without adopting the current recycling scheme. FIG. 5B is a waveform showing a result of Hspice simulation of the output signal Vosc of the RC oscillator with adopting the current recycling scheme according to the present invention.

Figure 6:
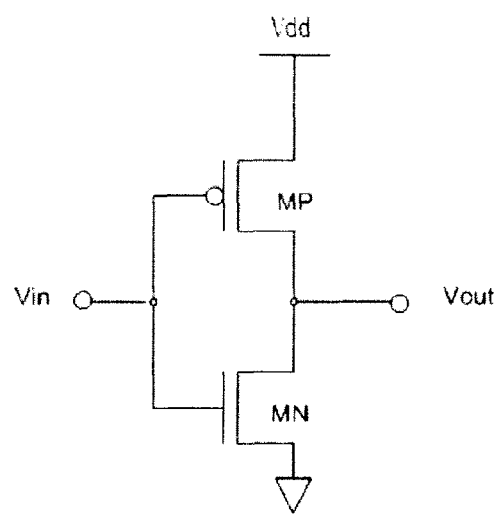
FIG. 6 is a circuit diagram showing a voltage sensor for sensing voltage levels at first and second nodes in the voltage sensing and outputting unit.
Figure 7A:
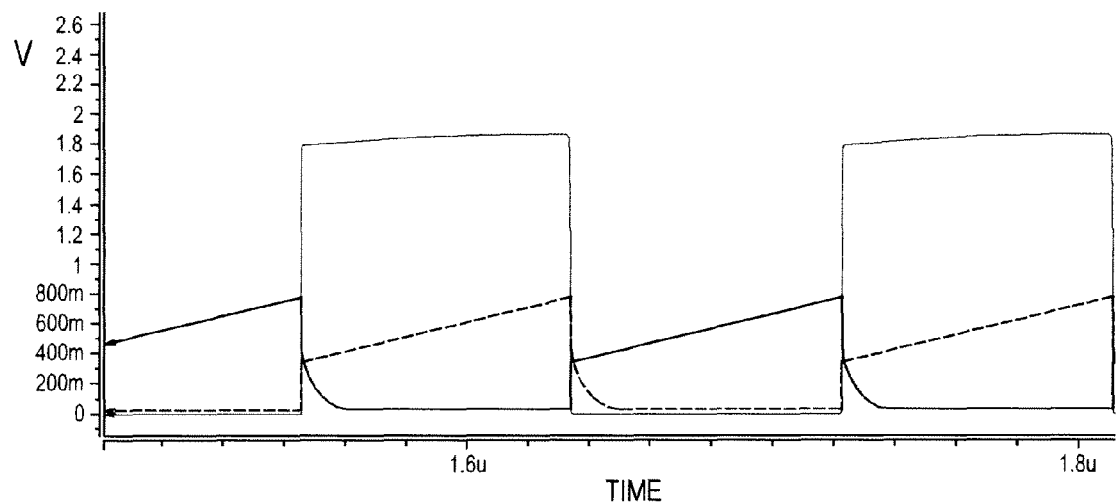
FIG. 7A is a waveform showing a result of Hspice simulation of the output signal of the RC oscillator without adjusting a sensing voltage of a voltage sensor.
Figure 7B:
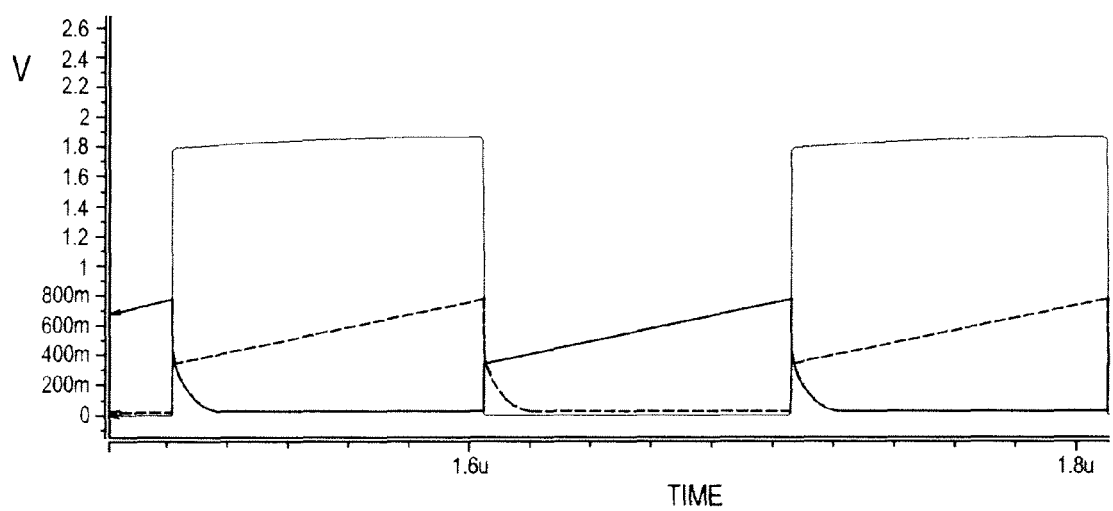
FIG. 7B is a waveform showing a result of Hspice simulation of the output signal of the RC oscillator with adjusting a sensing voltage of a voltage sensor.

FIG. 6 is a circuit diagram showing a voltage sensor 142 for sensing voltage levels at the first and second nodes N1 and N2 in the voltage sensing and outputting unit 140. As shown in FIG. 6, the voltage sensor 142 may include a PMOS transistor MP and an NMOS transistor MN, which are connected between the power supply voltage and the ground in series. In one embodiment, the gates of the PMOS and NMOS transistors MP and MN may be coupled to the first node N1 or the second node N2 to receive a signal therefrom. The voltage sensor 142 may be operable to output an output voltage of logic high or logic low to the RS latch according to the sensed voltage at the first or second node N1 or N2. The logic threshold VT of the voltage sensor 142 may be determined by the following equation.

$$V_{TH} = \frac{V_{dd} + V_{Tp} + \sqrt{\frac{\mu_n (W/L)_n}{\mu_p (W/L)_p}} \cdot V_{Tn}}{1 + \sqrt{\frac{\mu_n (W/L)_n}{\mu_p (W/L)_p}}} \quad (3)$$

wherein Vdd represents a power supply voltage, $V_{Tp}$ and $V_{Tn}$, represent threshold voltages of the PMOS transistor MP and the NMOS transistor MN, $\mu_p$ and $\mu_n$ represent mobility of the PMOS transistor MP and the NMOS transistor MN, and $(W/L)_p$ and $(W/L)_n$ represent a ratio of a width to a length of the PMOS transistor MP and the NMOS transistor MN. Thus, if width-to-length ratios of the PMOS transistor MP and the NMOS transistor MN are adjusted, then the sensing voltage by the voltage sensor 142 may be adjusted. FIG. 7A is a waveform showing a result of Hspice simulation of the output signal of the RC oscillator without adjusting the sensing voltage. FIG. 7B is a waveform showing a result of Hspice simulation of the output signal of the RC oscillator with adjusting the sensing voltage.

Experimentally, when the conventional RC oscillator is applied to a flat panel display having a qVGA resolution, the total power consumption is 494.8 μW at a clock frequency of 5.63 MHz, while the total power consumption is 53.06 μW when the RC oscillator of the present invention is applied to the same product. As such, the power consumption of 89.3% may be reduced in one embodiment.

Since the power consumption can be reduced according to the present invention, the use time of the various portable devices using the battery life may be remarkably extended with only one charge. Also, when the RC oscillator of the embodiment is adopted to a driving circuit of the portable flat display, the power consumption may be efficiently reduced.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A resistor-capacitor (RC) oscillator, comprising:
a voltage transforming unit configured to transform a power supply voltage to an internal voltage;
a current mirroring unit coupled to the voltage transforming unit and being configured to receive the internal voltage to provide two constant current outputs with different phases;
a current charging/discharging unit including first and second nodes to receive the two constant current outputs of the current mirroring unit, wherein first and second capacitors coupled to the first and second nodes, respectively, are charged by the two constant current outputs, the current charging/discharging unit further including a first discharge switch and a second discharge switch configured to discharge the first capacitor and the second capacitor respectively;
a voltage sensing and outputting unit coupled to the first and second nodes and being configured to sense voltage levels of the first and second nodes and output clock signals when one of the sensed voltage levels is greater than a logic threshold; and
a pulse generating unit configured to generate pulse signals in response to the clock signals,
wherein the current charging/discharging unit further includes a connection switch to electrically connect the first and second nodes in response to the pulse signals.

2. The RC oscillator of claim 1, wherein the current mirroring unit includes a variable resistor to adjust the current outputs provided from the current mirroring unit.

3. The RC oscillator of claim 1, wherein the voltage sensing and outputting unit includes a RS latch configured with a first NAND gate and a second NAND gate.

4. The RC oscillator of claim 3, wherein the voltage sensing and outputting unit includes a PMOS transistor and an NMOS transistor connected between a power supply voltage and the ground in series, and wherein gates of the PMOS transistor and the NMOS transistor are connected to the first and second nodes, respectively.

5. The RC oscillator of claim 3, wherein
the first capacitor is coupled to the first node and configured to be charged by the current output provided to the first node;
the second capacitor is coupled to the second node and configured to be charged by the current output provided to the second node;
the first discharge switch is coupled between the first node and the ground, the first discharge switch and configured to be turned on/off in response to an output signal of the first NAND gate; and
the second discharge switch is coupled between the second node and the ground, the second discharge switch and configured to be turned on/off in response to an output signal of the second NAND gate.

6. The RC oscillator of claim 1, wherein the voltage transforming unit includes:
a reference voltage generator configured to receive the power supply voltage to generate a reference voltage;
an operational amplifier (OP AMP) receiving the reference voltage as an input thereof;
a PMOS transistor having a gate coupled to an output terminal of the OP AMP and being configured to receive the power supply voltage and output the internal voltage; and
a compensation capacitor configured to compensate a phase of the output signals of the OP AMP.

7. The RC oscillator of claim 6, wherein the reference voltage generator includes:
a pair of PMOS transistors coupled to the power supply voltage for current mirroring;
first and second NMOS transistors coupled to the respective PMOS transistors and whose gates commonly receive the reference voltage; and
a resistor coupled to the second NMOS transistor and the ground.

* * * * *